(12) United States Patent
Lai et al.

(10) Patent No.: US 7,064,620 B1
(45) Date of Patent: Jun. 20, 2006

(54) SEQUENTIAL VCO PHASE OUTPUT ENABLING CIRCUIT

(75) Inventors: Kang-Wei Lai, Milpitas, CA (US); Greg Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 10/761,897

(22) Filed: Jan. 20, 2004

Related U.S. Application Data (60) Provisional application No. 60/469,541, filed on May 9, 2003.

(51) Int. Cl.
*H03B 27/00* (2006.01)
(52) U.S. Cl. .......................... 331/45; 331/57
(58) Field of Classification Search ............. 331/45, 331/57, 34, 74, 1 A; 327/152, 163; 375/373, 375/376
See application file for complete search history.

(56) References Cited

U.S. PATENT DOCUMENTS

| | | | | |
|---|---|---|---|---|
| 5,126,691 A | * | 6/1992 | Mijuskovic et al. | 331/1 A |
| 5,528,200 A | * | 6/1996 | Yamauchi et al. | 331/45 |
| 5,534,809 A | * | 7/1996 | Watanabe et al. | 327/269 |
| 5,854,576 A | * | 12/1998 | Swan | 331/57 |
| 6,114,915 A | * | 9/2000 | Huang et al. | 331/25 |
| 6,369,661 B1 | * | 4/2002 | Scott et al. | 331/45 |

* cited by examiner

*Primary Examiner*—Joseph Chang
(74) *Attorney, Agent, or Firm*—Townsend and Townsend and Crew LLP; J. Matthew Zigmant (57) ABSTRACT

Circuits, methods, and apparatus that provide a sequential start-up of outputs of an oscillator following a power-up or restart. The outputs are gated by enable signals. These enable signals are derived sequentially, the first in a series being triggered by a specific output of the oscillator.

20 Claims, 9 Drawing Sheets

SEQUENTIAL VCO PHASE OUTPUT ENABLING CIRCUIT

CROSS-REFERENCES TO RELATED APPLICATIONS

This application claims the benefit of U.S. provisional application No. 60/469,541, filed May 9, 2003, which is hereby incorporated by reference.

BACKGROUND

The present invention relates to phase-locked loops, and more particularly to the sequential start-up of clock outputs provided by a phase-locked loop.

Phase locked-loops are an essential building block of many integrated circuits, providing periodic signals for data recovery, data transfer, and other clocking functions. They often supply a clock signal to one or more counters or dividers that divide a signal from a voltage controlled oscillator (VCO) to a lower frequency clock signal for distribution around an integrated circuit or system. These dividers provide clock outputs that may have the same or different frequencies as compared to one another.

It is also often desirable that two or more of these clocks have a known and predictable phase relationship with each other. For example, when high speed data is clocked in parallel into a lower speed first-in-first-out (FIFO) memory, it is important that the timing of the data is correct, such that FIFO set-up and hold times are met.

A proper phase relationship may be achieved by using a VCO that has multiple outputs at known phases to each other, for example a ring oscillator. Unfortunately, these ring and similar types of oscillators typically power up in an indeterminate state. That is, there is uncertainty as far as which output of ring oscillator toggles first following power up. Also, a different output may toggle first each time the circuit is powered up.

This uncertainty means that different counters driven different taps of a ring oscillator begin counting at different times each time power is applied. This is also true following an asynchronous reset of the counters. The result is that the phase relationship of the counter outputs may not be what is needed for proper circuit operation.

Accordingly, what is needed are circuits, methods, and apparatus for providing predictability in the start-up of clock circuits having desired phase relationships following a power up or reset.

SUMMARY

Accordingly, embodiments of the present invention provide circuits, methods, and apparatus that provide a sequential start-up of outputs of an oscillator following a power-up or restart. The outputs of the VCO are gated by enable signals. These enable signals are derived from one another, the first in a series being triggered by a specific one of the outputs of the oscillator.

Embodiments of the present invention provide a high resolution and sequence controlled phase shift among the multiple clock outputs generated by VCO, counters, and related circuitry. Particularly when incorporated in programmable logic devices (PLDs), these embodiments provide a flexible and precise control of the relative phase shift between clock signals.

A better understanding of the nature and advantages of the present invention may be gained with reference to the following detailed description and the accompanying drawings.

BRIEF DESCRIPTION OF THE DRAWINGS

FIG. 2A is a block diagram of a ring oscillator that may be used as the VCO in FIG. 1, or as the VCO in other embodiments of the present invention, while

DESCRIPTION OF EXEMPLARY EMBODIMENTS

Figure 1:
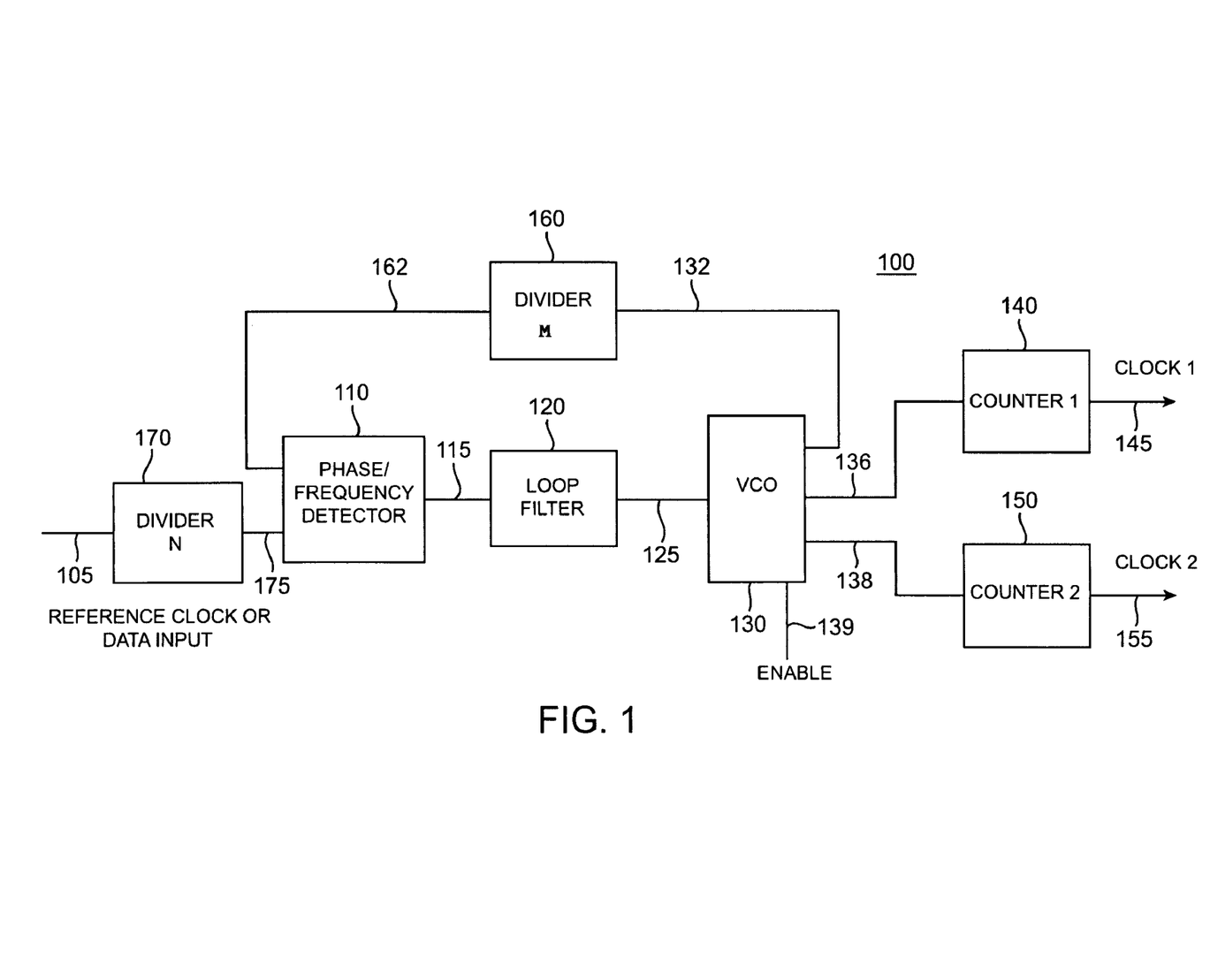
FIG. 1 is a block diagram of a phase-locked loop and associated circuitry that may benefit by incorporation of embodiments of the present invention.

FIG. 1 is a block diagram of a phase-locked loop and associated circuitry that may benefit by incorporation of embodiments of the present invention. This figure, as with all the included figures, is shown for exemplary purposes only and does not limit either the possible embodiments of the present invention or claims.

Included are a phase frequency detector 110, loop filter 120, VCO 130, two counters, counter 1 140 and counter 2 150, feedback divider 160, and input divider 170. The input divider 170 receives a reference clock or data input on line 105. This signal may be a received data signal such as that from Ethernet, USB, RF, or other signal source. This signal may alternately be generated by a crystal or other periodic clock source, or from another VCO counter, or related circuit. The phase frequency detector receives an output from the input divider 170 on line 175, and depending on its mode of operation, compares the phase or frequency of this signal to the phase or frequency of the frequency divided output signal received the divider 160 which is driven by VCO 130.

Phase frequency detector 110 provides an output, typically a charge up or charge down signal, on line 115 to the loop filter 120. Loop filter 120 may be an analog or digital filter. The filter maybe a lead-lag, low-pass, or other appropriate filter. The loop filter 120 provides an output on line 125 that controls the frequency of oscillation for the VCO 130.

VCO 130 is shown as providing three outputs. These outputs are periodic signals having the same frequency, but offset or shifted in phase relative to one another. In this example, three phase outputs are provided, though other numbers of outputs may be provided by embodiments of the present invention. The VCO outputs 136 and 138 in turn drive counter 1 140 and counter 2 150. These counters divide the VCO frequency to provide clock signals clock 1 on line 145 and clock 2 on line 155.

In a specific embodiment, each of these circuits is incorporated on an integrated circuit. Alternately, some or all of the loop filter 120 may be off chip. The clock signals may drive registers, FIFOs, and other circuitry either on or off the integrated circuit. These clock signals may be global or local clock signals, and may have different frequencies and different phase relationships. Each of the signals in this block diagram may be single-ended or differential.

Figure 2A:
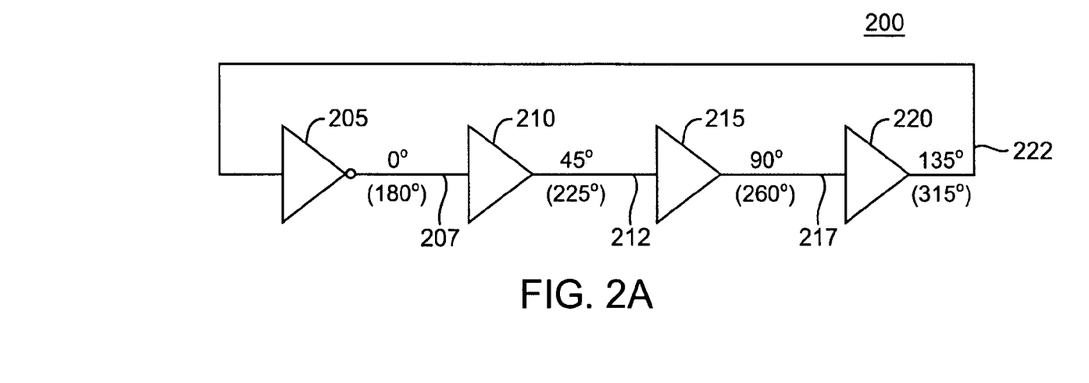

FIG. 2A is a block diagram of a ring oscillator that may be used as the VCO 130 in FIG. 1, or as the VCO in other embodiments of the present invention. Included are a first inverter 205 in series with buffers 210, 215, and 220. These inverters and buffers typically are configured identically, with the differential outputs from the inverter 205 simply switched or crossed. In this is specific example, there is one inverter and three buffers. Alternately, there may be a different number of inverters and buffers, such that there is a net inversion around the loop. For example, there maybe three inverters in series forming the ring oscillator 200, or three inverters in series with one buffer. In other embodiments, there may be other numbers of buffers and inverters, for example there may be 3, 5, 8, or other combined numbers of buffers and inverters.

The frequency of oscillation of this ring is controlled, typically by a control voltage on a control (not shown) from the loop filter 120. This control line may be a single analog voltage line or a digital bus. For example, it may switch load capacitors in and out of the buffers and inverters to vary the frequency of oscillation. It will be appreciated by one skilled in the art that many other control mechanisms are possible, for example, the tail currents in the inverters and buffers may be varied to control the frequency of oscillation.

Figure 2B:
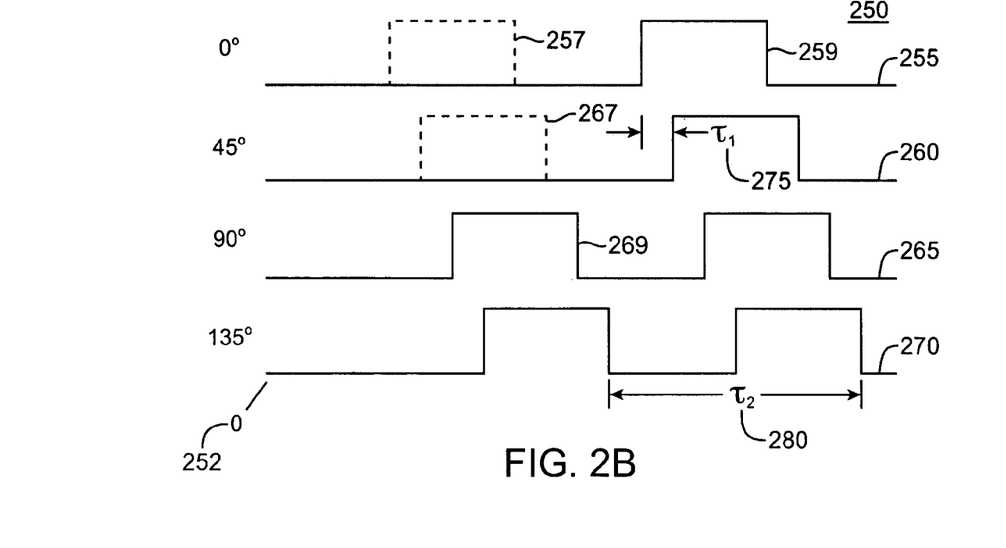
FIG. 2B is a timing diagram showing the phase relationship of the outputs signals of the inverter and buffers of FIG. 2A.

FIG. 2B is a timing diagram showing the phase relationship of the output signals of the inverter and buffers of FIG. 2A. Each of the outputs signals have the same period of oscillation, $t_2$ 280, and thus oscillate at the same frequency. Since there are four elements or stages in this example, the four outputs provide signals that are $\pi/4$ radians separated from each other in phase. The complementary outputs of each buffer and inverter also provides an output that is 180 degrees out of phase with the other output. For example, signals 255 and 260 are shifted in phase by an amount to $t_1$ 275, which is ideally 45 degrees.

At startup, each of the outputs of the inverters and buffers in the ring oscillator are near zero volts. In theory it would be possible for the ring oscillator to stay in this state. In practical circuits, the existence of noise or offset voltages or other mismatches in the inverters and buffers creates output voltages that are then amplified around the loop, such that the ring oscillates. This startup is implied by pulses 257 and 267, which are absent following a startup pulse at time 0 252.

In this particular example, the first clock pulse is provided by the output of buffer 215, specifically pulse 269. A counter which is counting pulses at the 90 degree output begins counting at the rising edge of pulse 269. A counter that is counting pulses at the output of the zero degree output does not count pulse 257 but does count pulse 259. Under different startup conditions, pulse 257 may exist and be thus counted. Accordingly, depending on the exact startup conditions, counters at the output of inverter 205, and buffer 215 may begin counting at different times relative to each other. The result is that the phase relationships between these counter signals may vary depending on the exact sequence of events following a startup. Similar results occur if these counters are reset asynchronously with the signals of the ring oscillator. In this particular example, the initial pulses following a power up shown as full amplitude signals. In practical circuits, the signals start small and become larger at a rate that depends on the Q of the ring oscillator loop.

Figure 3:
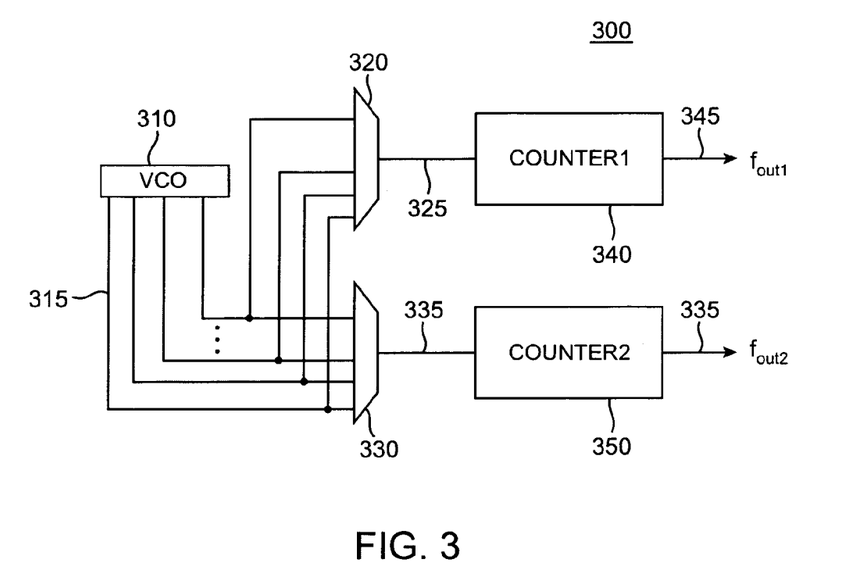
FIG. 3 illustrates the VCO and counters of FIG. 1 for a programmable logic device.

FIG. 3 illustrates the VCO and counters of FIG. 1 for a programmable logic device. Included are a VCO 310, multiplexers 320 and 330, and counters 340 and 350. Related circuitry is not included for simplicity. The VCO 310 provides a number of outputs 315 having the same frequency but shifted in phase relative to each other. Some or all of these outputs are provided to multiplexers 320 and 330. Multiplexers 320 and 330 select from these signals, providing one of them on lines 325 and 335 to the counters 340 and 350. The counters 340 and 350 cannot pulses, therefore by dividing the frequency of their input clock signals. The counters 340 and 350 provide clock signals on lines 345 and 355. These clock signals may be high or low speed, local or global, or other types of clock signals.

By selecting different phase shifted signals 315 from the VCO 310 using the multiplexers 320 and 330, the phase relationships between the clock signals on lines 345 and 355 may be adjusted. A larger number of outputs, corresponding to a larger number of elements in VCO 310, means that these output clocks may be shifted relative to each other with a finer granularity or resolution.

In order to achieve a predictable delay between multiply clock outputs from a PLL or DLL, different taps from the VCO may be used to provide a high resolution phase shift.

The resolution that can be achieved using this method can be found by:

$$\Delta t_{fine} = \frac{1}{2n} T_{VCO} = \frac{1}{2nf_{VCO}} - \frac{N}{8Mf_{ref}}$$

where:
$f_{ref}$ is input reference clock frequency;
N is the divide ratio between the input and output signals of counter 170 in FIG. 1;
M is the counter or divider 160 in the feedback path from the VCO to the phase-frequency detector; and n is the number of stages in the VCO. In this equation, the 2 in the denominator results from the VCO being differential.

Using this type of circuit allows small shifts or high resolution in the phase between two or more output clocks. If, for example, the VCO is running at 1 GHz, then the phase resolution is 125 pS. This is independent of process, temperature, and supply.

Figure 4:
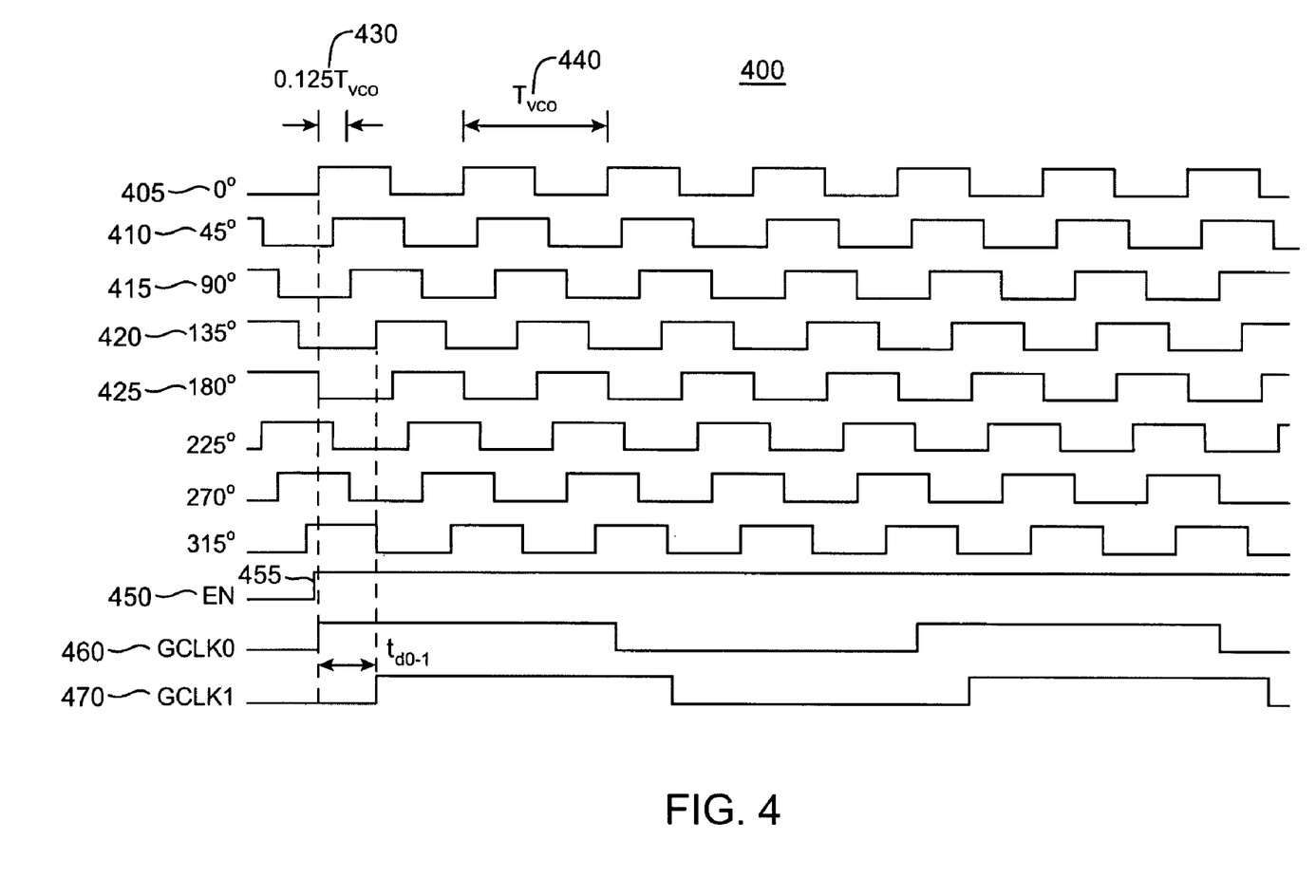
FIG. 4 is a timing diagram for a specific implementation of the circuitry of FIGS. 2A and 3.

FIG. 4 is a timing diagram for a specific implementation of the circuitry of FIGS. 2A and 3. Included are phase outputs having 0, 45, 90, and 135 degree separation. The complements of these signals, specifically signals 180, 225, 270, and 315 are also shown. And enable signal 415 is asserted at edge 455. Following this, the counters are enabled and provide outputs 416 and 470. As can be seen, depending on the relative position of the edge 455 as compared to the rising edges of the various phase outputs, these counters will begin counting at different times, and thus provide clocks having different phase relationships.

This enable signal may be an actual enable signal, or it may be a power up signal that is asserted sometime after power is applied to the integrated circuit. Alternately, the enable signal may be a clear or reset type of signal that clears one or more counters. Alternately, the enable signal may be externally controlled.

Figure 5:
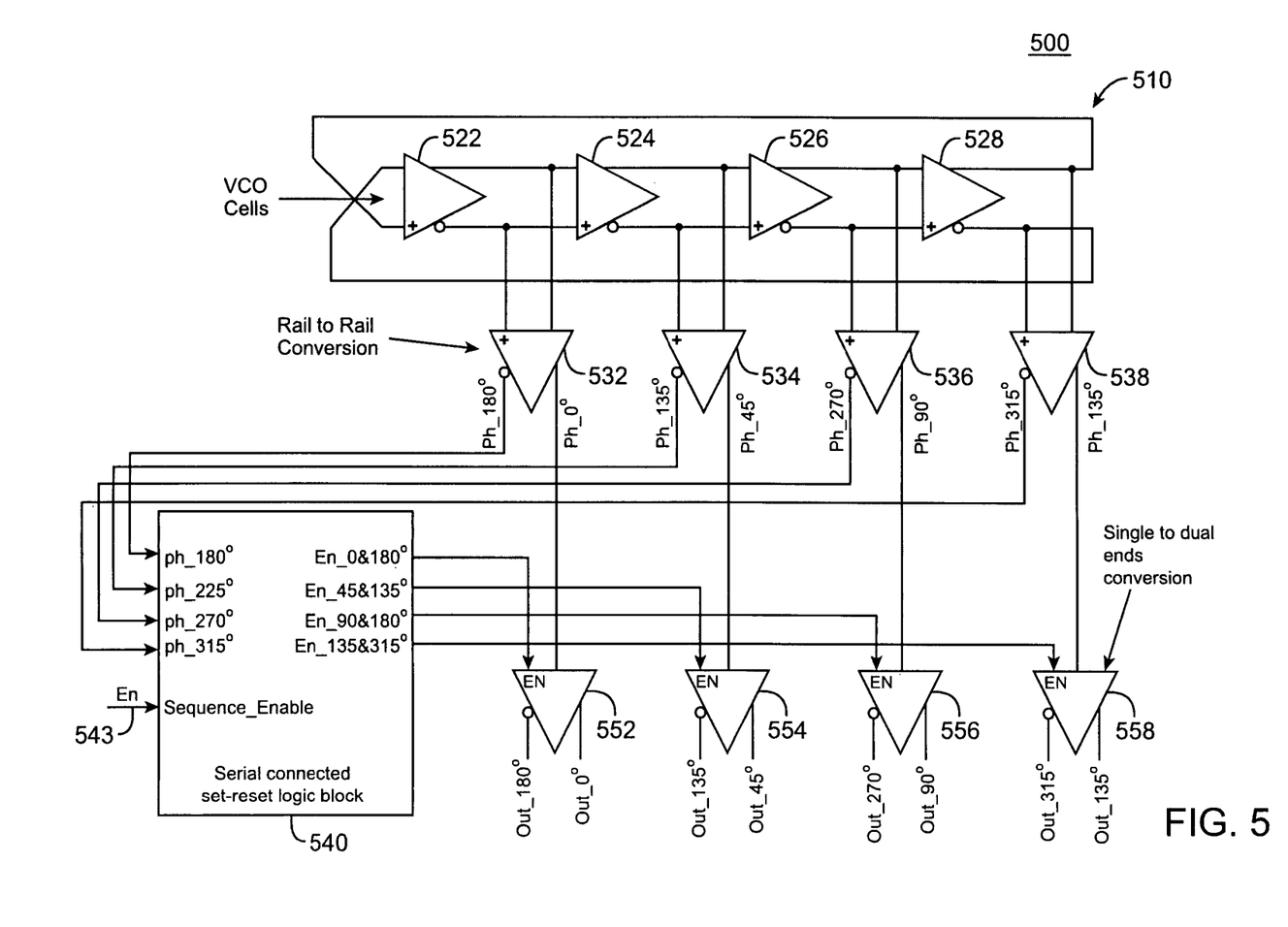
FIG. 5 is a block diagram illustrating an embodiment of the present invention.

FIG. 5 is a block diagram illustrating an embodiment of the present invention. Included are a ring oscillator 510 made up of VCO cells 522, 524, 526, and 528, buffers 532, 534, 536, and 538, reset logic block 540, and gated output circuits 522, 554, 556, and 558.

Again, the VCO cells are typically designed and layed out such that the individual delays for each cell are matched. As before, the frequency of oscillation around the loop is dependent on the delay through each cell, which may be varied or controlled by one or more control lines. These control lines have been omitted for simplicity and clarity. Each of the outputs around the ring oscillator, that is each of the ring oscillator taps, is buffered by a buffer such as 532. These buffers gain the ring oscillator signals, and in a specific embodiment provide a rail-to-rail output signal.

The outputs of these buffers is to drive gated circuits 552, 554, 556, and 558, as well as reset logic block 540. Reset logic block receives an enable signal on line 543, and provides sequential enable signals to the gated output buffers. Again, in this specific example, four VCO elements are shown. In other embodiment of the present invention, there may be even more than four elements. For example, two or three elements may be used. Alternately, there may be 5 or more elements used. A larger number of elements requires a higher bandwidth for each element in order to achieve the same frequency of oscillation, but provides a finer resolution and granularity of the phase angles between clock signals.

Figure 6:
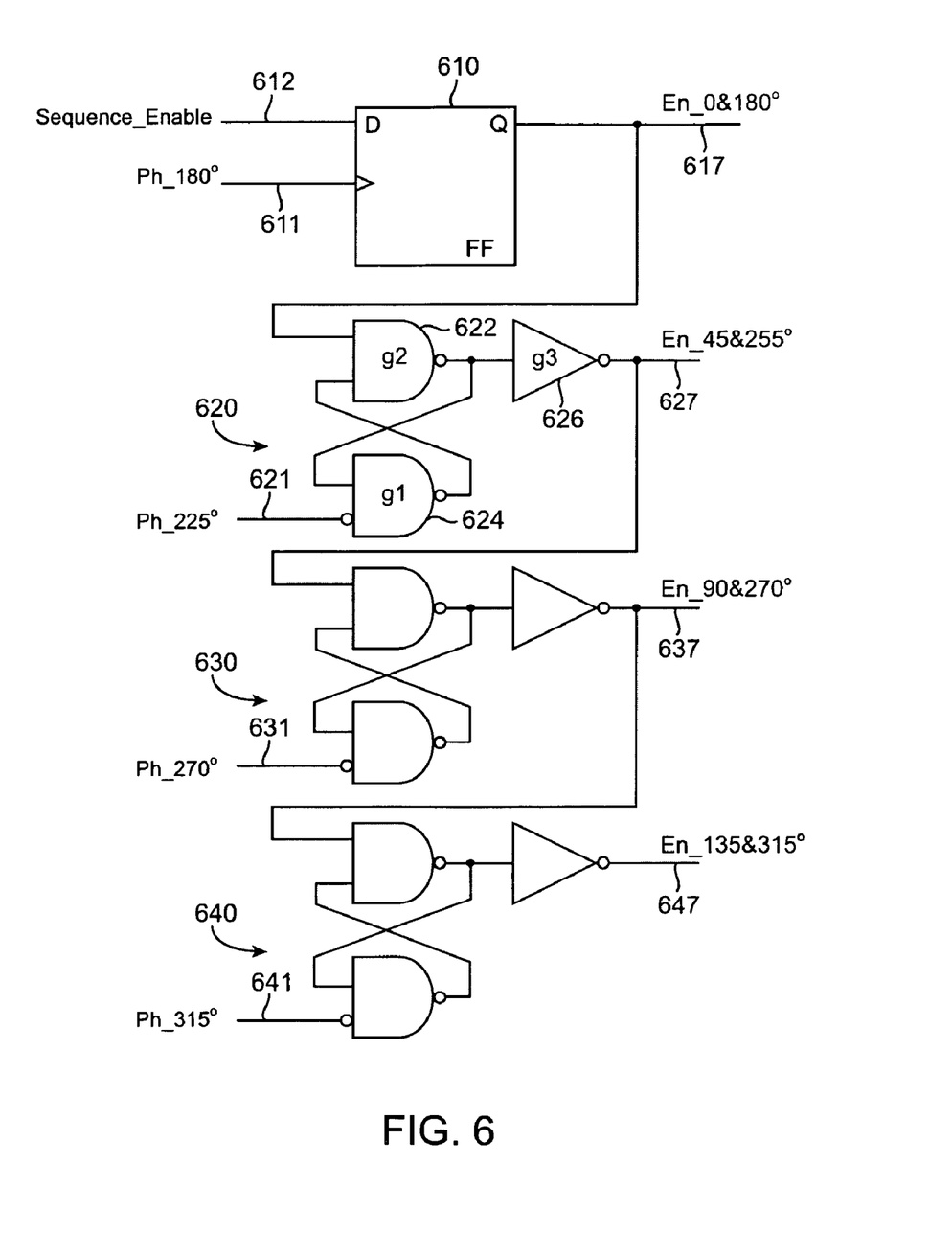
FIG. 6 illustrates a specific embodiment of the reset logic block 540 according to an embodiment of the present invention.

FIG. 6 illustrates a specific embodiment of the reset logic block 540 according to an embodiment of the present invention. Included are flip-flop 610, as well as set-reset blocks 620, 630, and 640. Each of these set-reset blocks include two NAND gates and an inverter. For example, set-reset block 620 includes NAND gates 622 and 624 as well as inverter 626.

Flip-flop 610 receives a sequence enable signal at its D input. The sequence enable signal on line 612 is clocked by an output of the VCO on line 611. The output of the flip-flop 610 provides an enable signal for the O-phase gated output on line 617. This output also drives an input of the set-reset block 620. When the phase-shifted clock input on line 621 goes high, the enable signal on line 627 enables for the 45 degree phase output on line 627 goes high. This continues for the 90 and 135 degree output enable signals on lines 637 and 647.

In short, this block receives a sequence enable signal on line 612. The signal is retimed by flip-flop 610 to the next rising edge of the clock signal on line 611. This provides an output signal that ripples through a chain of storage elements providing enable signals on subsequent rising edges of clock signals. In this way, the output clock signals of a multiphase VCO, such as a ring or other multiphase oscillator may be enabled in any sequence desired.

It will be obvious to one skilled in the prior art that other circuits may be used to implement this function. For example, flip-flops may replace the set-reset elements 620, 630, and 640. Also, the various phases are shown as being enabled in a linear sequence, specifically the 0 is enabled, followed by phases having 45, 90, and 135 degrees. In other embodiment of the present invention, the sequence may be altered with the addition of simple combinational logic, for example 0 degrees may be enabled first, followed by 90, 45, then 135 degrees. Alternately, a different number of set-reset elements or flip flops may be included. For example, if eight set-reset elements are included and separate buffers used for the true and complementary outputs of the ring oscillator, then the individual phased outputs may be separately enabled, for example in the sequence 0, 45, 90, 135, 180, 225, 270, and 315. In other embodiments, different number of ring oscillator elements, set-reset elements, and output buffers may be used consistent with the present invention.

Figure 7:
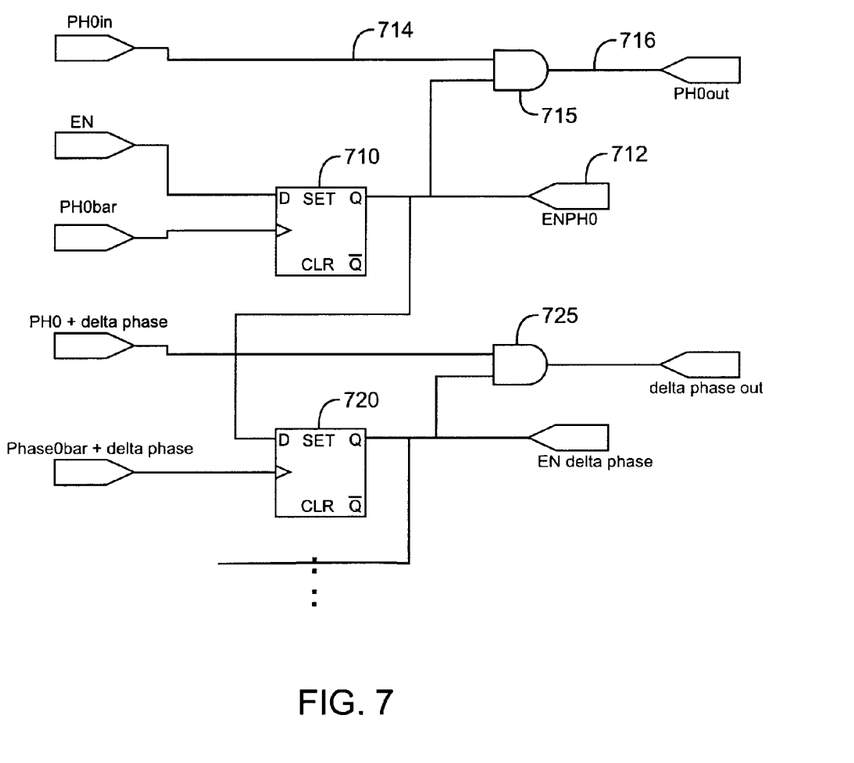
FIG. 7 is a schematic of a reset logic block that may be used as the reset logic block in FIG. 5 or other embodiments of the present invention.

FIG. 7 is a schematic of a reset logic block that may be used as the reset logic block 540 in FIG. 5 or other embodiments of the present invention. Included are flip-flops 710 and 720, and AND gates 715 and 725.

Again, register 710 receives an enable signal at its D input and an output of the VCO at its clock input. Flip-flop 710 retimes the enable signal to the desired edge of the VCO output and provides an enable signal on line 712 to AND gate 715 and provides a gating function gating the VCO output signal on line 714, thus providing a gated VCO output on line 716. Again, the enable signal on line 712 ripples to the second flip-flop 720, where it is clocked by another output of the VCO.

Figure 8:
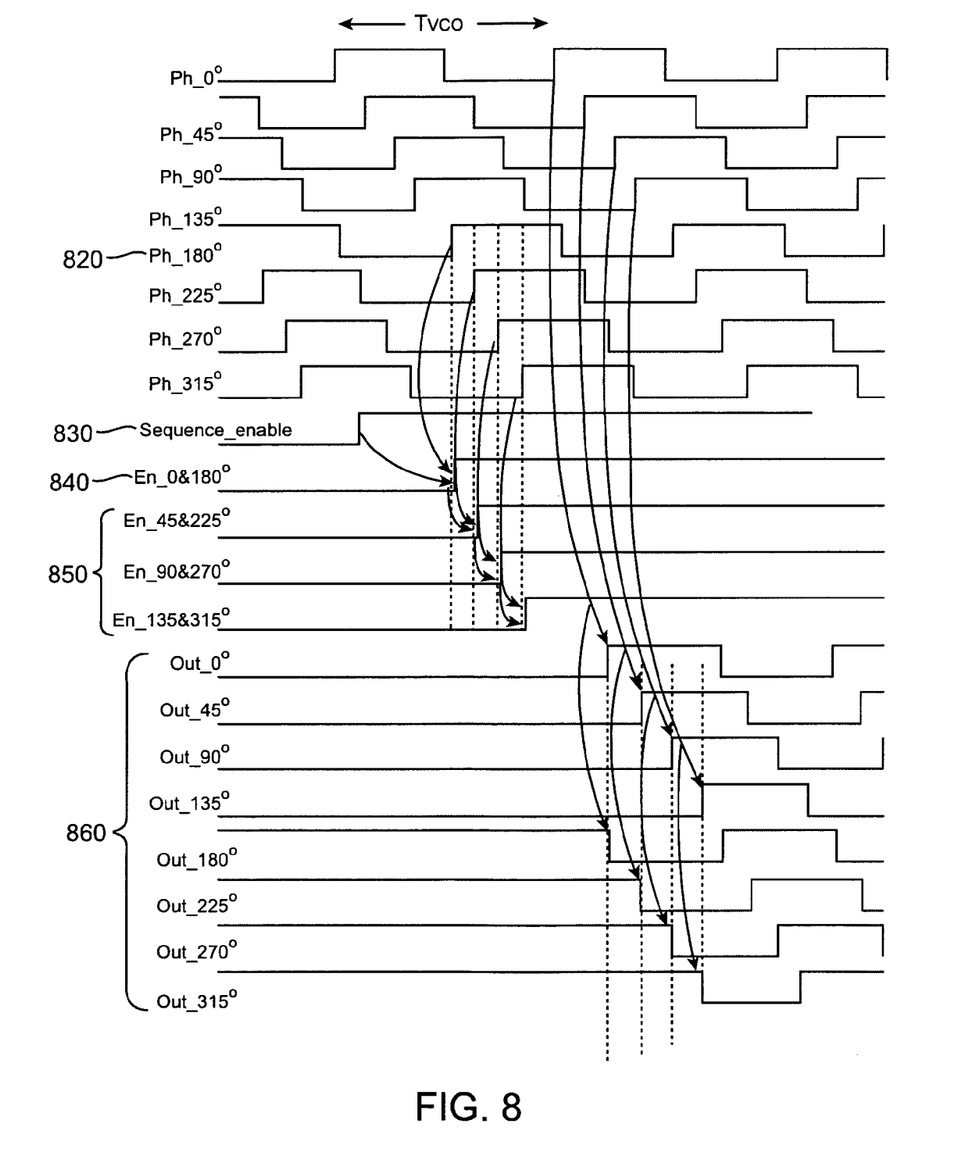
FIG. 8 is a timing diagram for an embodiment of the present invention.

FIG. 8 is a timing diagram for an embodiment of the present invention, such as the circuit in FIG. 5. In this example, the VCO output corresponding to 180 degrees phase shift signal 820, clocks a sequence enable signal 830 providing an enable signal 840. Subsequent enable signals 815 are provided. These enable signals allow the transmission of output signals 860.

Figure 9:
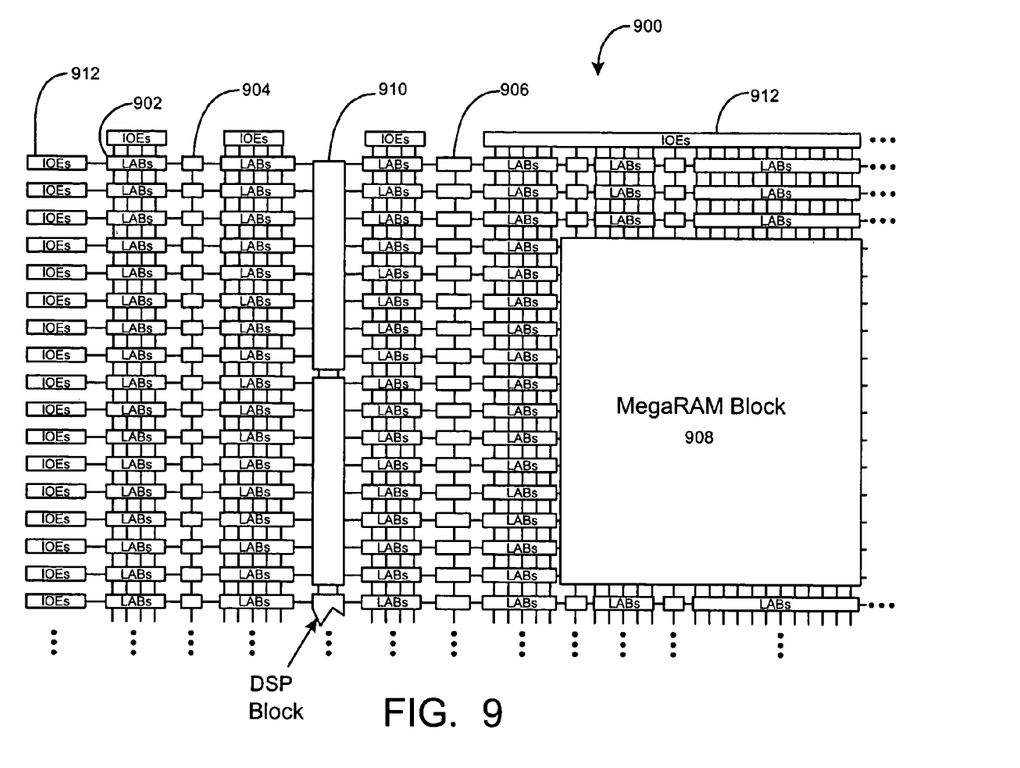
FIG. 9 is a simplified block diagram of a programmable logic device that can implement embodiments of the present invention.

FIG. 9 is a simplified partial block diagram of an exemplary high-density programmable logic device (PLD) 900 wherein techniques according to the present invention can be utilized. PLD 900 includes a two-dimensional array of programmable logic array blocks (or LABs) 902 that are interconnected by a network of column and row interconnects of varying length and speed. LABs 902 include multiple (e.g., 10) logic elements (or LEs), an LE being a small unit of logic that provides for efficient implementation of user defined logic functions.

PLD 900 also includes a distributed memory structure including RAM blocks of varying sizes provided throughout the array. The RAM blocks include, for example, 512 bit blocks 904, 4K blocks 906 and a MegaBlock 908 providing 512K bits of RAM. These memory blocks may also include shift registers and FIFO buffers. PLD 900 further includes digital signal processing (DSP) blocks 410 that can implement, for example, multipliers with add or subtract features. I/O elements (IOEs) 912 located, in this example, around the periphery of the device support numerous single-ended and differential I/O standards. It is to be understood that PLD 900 is described herein for illustrative purposes only and that the present invention can be implemented in many different types of PLDs, FPGAs, and the like. Embodiments of the present invention may be useful in clock management circuits (not shown), made using available logic array blocks, or in other sections of this PLD.

Figure 10:
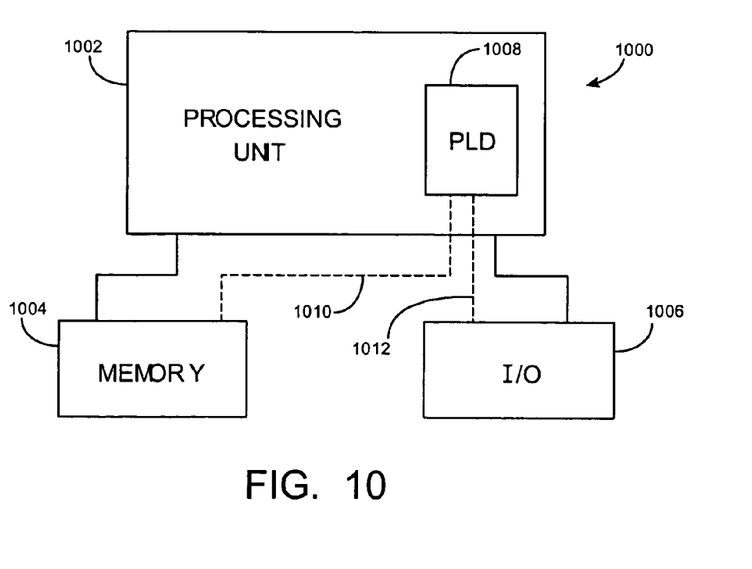
FIG. 10 is a block diagram of an electronic system that can implement embodiments of the present invention.

While PLDs of the type shown in FIG. 9 provide many of the resources required to implement system level solutions, the present invention can also benefit systems wherein a PLD is one of several components. FIG. 10 shows a block diagram of an exemplary digital system 1000, within which the present invention may be embodied. System 1000 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 1000 may be provided on a single board, on multiple boards, or within multiple enclosures.

System 1000 includes a processing unit 502, a memory unit 504 and an I/O unit 506 interconnected together by one or more buses. According to this exemplary embodiment, a programmable logic device (PLD) 1008 is embedded in processing unit 1002. PLD 1008 may serve many different purposes within the system in FIG. 10. PLD 1008 can, for example, be a logical building block of processing unit 1002, supporting its internal and external operations. PLD 1008 is programmed to implement the logical functions necessary to carry on its particular role in system operation. PLD 1008 may be specially coupled to memory 1004 through connection 1010 and to I/O unit 1006 through connection 1012.

Processing unit 1002 may direct data to an appropriate system component for processing or storage, execute a program stored in memory 1004 or receive and transmit data via I/O unit 1006, or other similar function. Processing unit 1002 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 1008 can control the logical operations of the system. In an embodiment, PLD 1008 acts as a reconfigurable processor, which can be reprogrammed as needed to handle a particular computing task. Alternately, programmable logic device 1008 may itself include an embedded microprocessor. Memory unit 1004 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A voltage controlled oscillator comprising:
    a first VCO element having an output;
    a second VCO element having an input and an output, the input coupled to the output of the first VCO element;
    a first gated circuit having an input and an output, the input coupled to the output of the first VCO element;
    a second gated circuit having an input and an output, the input coupled to the output of the second VCO element; and
    a first logic circuit configured to receive a VCO enable signal, the output of the first VCO element, and the output of the second VCO element, and further configured to provide a first output enable signal to the first gated circuit and a second output enable signal to the second gated circuit.

2. The voltage controlled oscillator of claim 1 wherein the first logic circuit retimes the VCO enable signal with a signal at the output of the first VCO element to provide the first output enable signal.

3. The voltage controlled oscillator of claim 2 wherein the first logic circuit retimes the VCO enable signal using a register.

4. The voltage controlled oscillator of claim 2 wherein the first logic circuit retimes the first output enable signal with a signal at the output of the second VCO element to provide the second output enable signal.

5. The voltage controlled oscillator of claim 4 wherein the first logic circuit retimes the first output enable signal using a register.

6. The voltage controlled oscillator of claim 5 wherein the first logic circuit retimes the first output enable signal using a latch.

7. The voltage controlled oscillator of claim 2 wherein the output of the first gated circuit couples to a first counter and the output of the second gated circuit coupled to the second gated counter.

8. The voltage controlled oscillator of claim 2 wherein the first VCO element and the second VCO element form a portion of a ring oscillator.

9. The voltage controlled oscillator of claim 2 wherein the output of the first VCO element is buffered by a first buffer and the output of the second VCO element is buffered by a second buffer.

10. The voltage controlled oscillator of claim 2 wherein the voltage controlled oscillator is formed on an integrated circuit.

11. The voltage controlled oscillator of claim 10 wherein the VCO enable signal is generated following an increase in a supply voltage for the integrated circuit.

12. The voltage controlled oscillator of claim 2 wherein the VCO enable signal is a reset signal that resets a counter.

13. A method of enabling outputs of a voltage controlled oscillator comprising:
    receiving a VCO enable signal;
    receiving a first VCO output signal;
    receiving a second VCO output signal, the second VCO output signal phase shifted from the first VCO output signal; and
    retiming the VCO enable signal with the first VCO output signal to generate a first VCO output enable signal.

14. The method of claim 13 further comprising:
    retiming the first VCO output enable signal with the second VCO output signal to generate a second VCO output enable signal.

15. The method of claim 13 wherein when the first VCO output enable signal is asserted, the first VCO output signal is received by a logic circuit.

16. The method of claim 15 wherein the logic circuit is a counter.

17. The method of claim 15 wherein the logic circuit is a first-in-first-out memory.

18. A voltage controlled oscillator comprising:
    means for generating a plurality of clock outputs including a first clock output and a second clock output, the first and second clock outputs shifted in phase relative to each other;
    means for gating the first clock output and the second clock output;
    means for receiving a VCO enable signal; and
    means for retiming the VCO enable signal to the first clock output to generate a first gating signal,
    wherein the first gating signal controls the means for gating the first clock output.

19. The voltage controlled oscillator of claim 18 further comprising:
   means for retiming the first gating signal using the second clock output to generate a second gating signal, wherein the second gating signal controls the means for gating the second clock output.

20. The voltage controlled oscillator of claim 19 further comprising:
   means for counting pulses of the gated first clock output to generate a first counter output.

* * * * *